(12) United States Patent
Moens et al.

(10) Patent No.: US 10,090,380 B2
(45) Date of Patent: Oct. 2, 2018

(54) SEMICONDUCTOR DEVICE HAVING LOCALIZED CHARGE BALANCE STRUCTURE AND METHOD

(71) Applicant: SEMICONDUCTOR COMPONENTS INDUSTRIES, LLC, Phoenix, AZ (US)

(72) Inventors: Peter Moens, Zottegem (BE); Ana Villamor, Barcelona (ES); Piet Vanmeerbeek, Sleidinge (BE); Jaume Roig-Guitart, Oudenaarde (BE); Filip Bogman, Dendermonde (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 109 days.

(21) Appl. No.: 15/009,380

(22) Filed: Jan. 28, 2016

(65) Prior Publication Data

US 2016/0148997 A1    May 26, 2016

Related U.S. Application Data

(62) Division of application No. 14/032,454, filed on Sep. 20, 2013, now Pat. No. 9,287,371.

(Continued)

(51) Int. Cl.
*H01L 21/336* (2006.01)
*H01L 29/06* (2006.01)
(Continued)

(52) U.S. Cl.
CPC ........ *H01L 29/0634* (2013.01); *H01L 21/265* (2013.01); *H01L 21/26586* (2013.01);
(Continued)

(58) Field of Classification Search
CPC .................................................. H01L 29/0634
See application file for complete search history.

(56) References Cited

U.S. PATENT DOCUMENTS 5,572,048 A    11/1996  Sugawara
6,465,863 B1  10/2002  Deboy et al.
(Continued)

OTHER PUBLICATIONS

Syotaro Ono, et al., Design concept of n-buffer layer (n-Bottom Assist Layer) for 600V-class Semi-Super Junction MOSFET, Proceedings of the 19th International Symposium on Power Semiconductor Devices & ICs, May 27-30, 2007 Jeju, Korea.

(Continued)

*Primary Examiner* — Meiya Li
*Assistant Examiner* — Peter M Albrecht
(74) *Attorney, Agent, or Firm* — Kevin B. Jackson

(57) ABSTRACT

In one embodiment, a semiconductor substrate is provided having a localized superjunction structure extending from a major surface. A doped region is then formed adjacent the localized superjunction structure to create a charge imbalance therein. In one embodiment, the doped region can be an ion implanted region formed within the localized superjunction structure. In another embodiment, the doped region can be an epitaxial layer having a graded dopant profile adjoining the localized superjunction structure. The charge imbalance can improve, among other things, unclamped inductive switching (UIS) performance.

20 Claims, 3 Drawing Sheets

Related U.S. Application Data

(60) Provisional application No. 61/710,526, filed on Oct. 5, 2012.

(51) Int. Cl.
  *H01L 29/36* (2006.01)
  *H01L 21/265* (2006.01)
  *H01L 29/66* (2006.01)
  *H01L 29/78* (2006.01)
  *H01L 29/10* (2006.01)
  *H01L 29/739* (2006.01)
  *H01L 21/76* (2006.01)

(52) U.S. Cl.
  CPC .......... *H01L 21/76* (2013.01); *H01L 29/0649* (2013.01); *H01L 29/1095* (2013.01); *H01L 29/36* (2013.01); *H01L 29/66348* (2013.01); *H01L 29/66734* (2013.01); *H01L 29/7397* (2013.01); *H01L 29/7813* (2013.01)

(56) References Cited

U.S. PATENT DOCUMENTS

| | | | |
|---|---|---|---|
| 6,479,876 B1 | 11/2002 | Deboy et al. | |
| 6,633,064 B2 | 10/2003 | Auerbach et al. | |
| 6,768,170 B2 | 7/2004 | Zhou | |
| 6,828,609 B2 | 12/2004 | Deboy et al. | |
| 7,176,524 B2 | 2/2007 | Loechelt et al. | |
| 7,253,477 B2 | 8/2007 | Loechelt et al. | |
| 7,285,823 B2 | 10/2007 | Loechelt et al. | |
| 7,372,111 B2 | 5/2008 | Onishi et al. | |
| 7,411,266 B2 | 8/2008 | Tu et al. | |
| 7,482,220 B2 | 1/2009 | Loechelt et al. | |
| 7,602,601 B2 | 10/2009 | Togashi | |
| 7,696,600 B2 | 4/2010 | Mauder et al. | |
| 7,902,075 B2 | 3/2011 | Grivna et al. | |
| 7,960,781 B2 | 6/2011 | Loechelt et al. | |
| 8,106,436 B2 | 1/2012 | Grivna et al. | |
| 8,372,716 B2 | 2/2013 | Loechelt et al. | |
| 8,389,369 B2 | 3/2013 | Loechelt | |
| 2004/0108568 A1 | 6/2004 | Qu | |
| 2005/0082570 A1* | 4/2005 | Sridevan | H01L 29/0634 257/197 |
| 2005/0242411 A1 | 11/2005 | Tso | |
| 2006/0180947 A1* | 8/2006 | Loechelt | H01L 21/761 257/510 |
| 2007/0001194 A1 | 1/2007 | Ono et al. | |
| 2008/0128798 A1 | 6/2008 | Schulze et al. | |
| 2008/0217707 A1* | 9/2008 | Anderson | H01L 29/783 257/412 |
| 2008/0246079 A1 | 10/2008 | Saito et al. | |
| 2010/0059814 A1 | 3/2010 | Loechelt et al. | |
| 2010/0187604 A1 | 7/2010 | Ono et al. | |
| 2010/0314682 A1* | 12/2010 | Yilmaz | H01L 29/0661 257/328 |
| 2010/0317158 A1 | 12/2010 | Yilmaz et al. | |
| 2011/0278650 A1 | 11/2011 | Tamaki et al. | |
| 2012/0187527 A1 | 7/2012 | Guitart et al. | |

OTHER PUBLICATIONS

Hideharu Egawa, Avalanche Characteristics of Failure Mechanism of High Voltage Diodes, IEEE Xplore, Transactions on Electron Devices, vol. ED-13, Nov. 1966.

Wataru, Saito, et al., A 20mΩcm2 600 V-class Superjunction MOSFET, Proceedings of 2004 International Symposium on Power Semiconductor Devices & ICs, Kitayushu, pp. 459-462.

* cited by examiner

SEMICONDUCTOR DEVICE HAVING LOCALIZED CHARGE BALANCE STRUCTURE AND METHOD

CROSS REFERENCE TO RELATED APPLICATION

This application is a divisional application of U.S. patent application Ser. No. 14/032,454 filed on Sep. 20, 2013 and issued as U.S. Pat. No. 9,287,371 on Mar. 15, 2016, which claims the benefit of priority from U.S. Provisional Application No. 61/710,526, which was filed on Oct. 5, 2012, both of which are fully incorporated herein.

BACKGROUND

The present invention relates, in general, to electronics and, more particularly, to methods of forming semiconductors and structures therefore.

Metal-oxide semiconductor field effect transistors (MOSFETs) are a common type of power switching device. A MOSFET device includes a source region, a drain region, a channel region extending between the source and drain regions, and a gate structure provided adjacent to the channel region. The gate structure includes a conductive gate electrode layer disposed adjacent to and separated from the channel region by a thin dielectric layer.

When a MOSFET device is in the on state, a voltage is applied to the gate structure to form a conduction channel region between the source and drain regions, which allows current to flow through the device. In the off state, any voltage applied to the gate structure is sufficiently low so that a conduction channel does not form, and thus current flow does not occur. During the off state, the device must support a high voltage between the source region and the drain region.

Today's higher voltage power switch market is driven by at least two major parameters, which include breakdown voltage (BVdss) and on-state resistance (Rdson). For a specific application, a minimum breakdown voltage is required, and in practice, designers typically can meet a BVdss specification. However, this is often at the expense of Rdson. This trade-off in performance is a major design challenge for manufacturers and users of high voltage power switching devices.

Recently, superjunction devices have gained in popularity to improve the trade-off between Rdson and BVdss. In previous n-channel superjunction devices, multiple heavily-doped diffused n-type and p-type regions replace one lightly doped n-type epitaxial region. In the on state, current flows through the heavily doped n-type regions, which lowers Rdson. In the off or blocking state, the heavily doped n-type and p-type regions deplete into or compensate each other to provide a high BVdss. More recently, price points for superjunction devices have become more attractive and market trends are driving demand for lower conduction and switching losses. Additional factors driving demands for superjunction devices include increased power conversion efficiency, increased power density requirements, smaller package requirements with demand for better performance, adoption of surface mount packages, and reductions in heat sinking requirements.

Although superjunction devices look promising, significant challenges still exist in manufacturing them. Another problem with previous superjunction devices is that the energy capability (Eas) under unclamped inductive switching (UIS) testing is often too low under optimum charge balance (for example, charge balance (CB) approaching 0%) or within a desired charge balance window. Such inadequate Eas capability is believed to be from low snapback current (Isnapback) in the reverse blocking IdVd curve. A low Isnapback can produce a pure electrical failure observed at few nanoseconds after switching-off the device in the typical UIS test. The electrical failure can occur when a negative differential resistance is reached at a certain region of the active area, thus producing a non-uniform current distribution and, eventually, a current focalization or a "hot spot". Additionally, a low Isnapback can limit the energy capability under other tests, such as reverse recovery tests.

Accordingly, it is desirable to have a structure for and method of making a superjunction semiconductor device that improves UIS performance. It would be beneficial if the structure and method maintained the design trade-offs between UIS, Rdson, and BVdss. Additionally, it would beneficial if the structure and method did not add significant process complexity or excessive costs.

Figure 1:
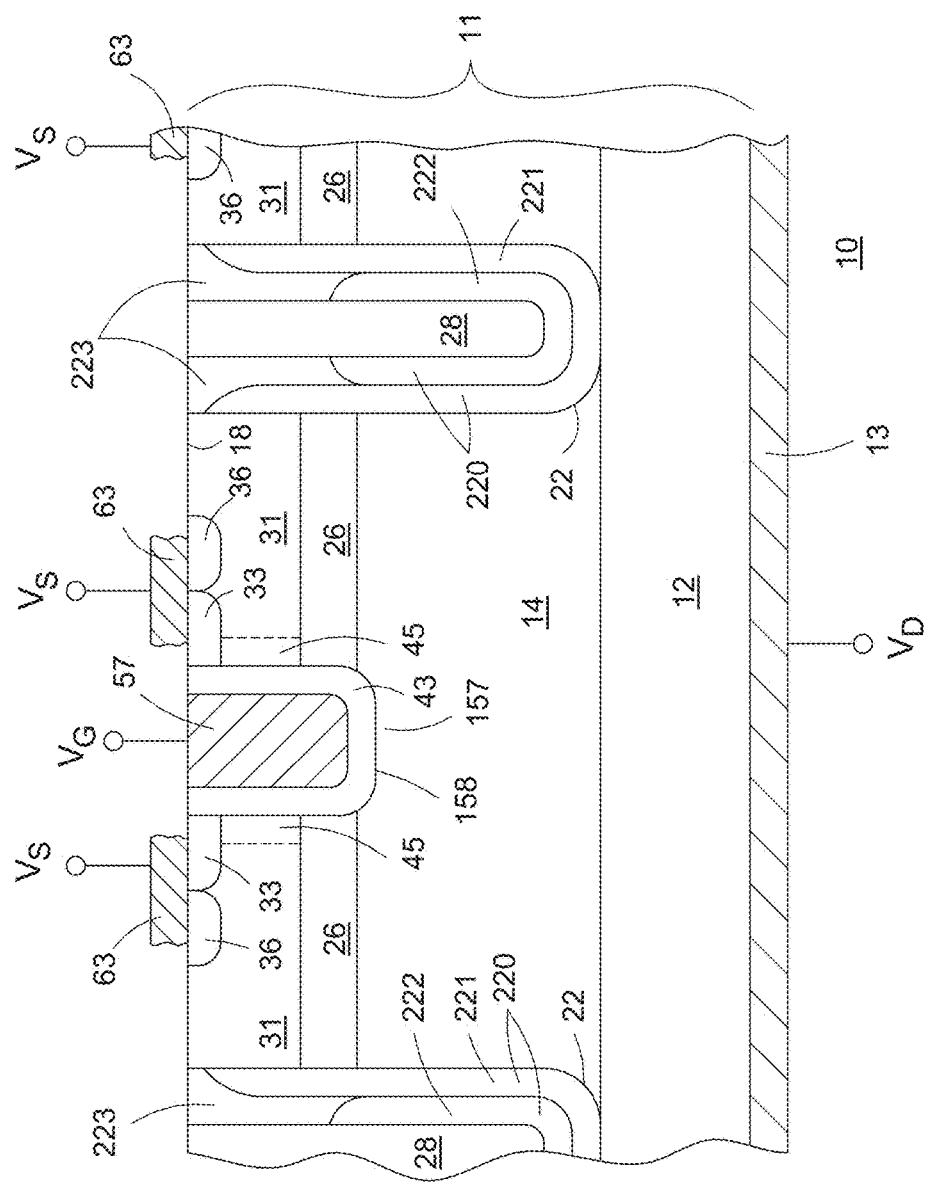
FIG. 1 illustrates a partial cross-sectional view of a semiconductor device in accordance with an embodiment of the present invention.

For simplicity and clarity of the illustration, elements in the figures are not necessarily drawn to scale, and the same reference numbers in different figures denote the same elements. Additionally, descriptions and details of well-known steps and elements are omitted for simplicity of the description. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

Furthermore, the term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

DETAILED DESCRIPTION OF THE DRAWINGS

Certain previous superjunction technologies are based on a local charge balanced (LCB) concept. By way of example, in LCB devices superjunction trenches can be formed by reactive ion etching in the active area of a semiconductor substrate and then lined with as-formed heavily-doped n-type and p-type layers. In one embodiment, an n-type layer is formed first, and then a p-type layer is formed thereafter. Typically, both the n-type and p-type doping is uniform along the entire superjunction trench depth. Thus, because there is no imbalance along the superjunction trench depth the electric field is therefore uniform for optimum charge balance and highest breakdown voltage. However, this configuration has been found to be underperforming for UIS conditions (where high avalanche current densities can occur) because of what is termed the Egawa effect. UIS performance data for previous 650 volt LCB devices has shown that for a charge balance (CB) of 0%, breakdown voltage (BVdss) ranges from about 650 volts (V) to about 750V, but UIS ranges from close to zero (0) milli-Joules/cm$^2$ (mJ/cm$^2$) to just above 650 mJ/cm$^2$, which is below desired target specifications. This data illustrates that an undesirable UIS performance can occur around an optimum charge balance condition where maximum breakdown can occur. Specifically, for an optimum charge balance and maximum breakdown voltage, the UIS robustness is near zero. This illustrates the problem to be addressed by the present embodiments that utilize a sufficiently tailored charge balanced structure in order to enhance UIS performance to be more acceptable.

The present description discloses a configuration that improves UIS performance, for example, in LCB superjunction structures. In the present description, the configuration is described in two representative embodiments both configured to create an imbalanced superjunction structure across a selected CB window. Stated another way, the present embodiments are configured to unbalance the dopant profiles in a selected location(s) in or proximate to the superjunction structure or column(s) so as to modify the electric field distribution along the superjunction column. The modified electric field has a less than flat profile or has a less than uniform profile along the superjunction column over the selected CB window. The present embodiments are configured to address the UIS robustness issues observed in previous superjunction embodiments.

The two example embodiments include electric field tailoring using ion implantation or a connection implant into upper portions of the superjunction structures, and electric field tailoring by using intrinsic-epitaxial (i-epi) dopant profile tailoring adjacent to the superjunction structures. Both embodiments are based, at least in part, on electric field (E-field) engineering such that the resultant E-field along the superjunction trench is purposely imbalanced. As a result, when minority and majority carriers are flowing in the device under avalanche conditions, minority and majority carriers do not significantly alter the E-field in such a way that the E-field becomes completely flat (as in an optimum charge balanced condition in previous devices). A flat E-field is believed to lead to the Egawa effect (also termed "E-field quenching"), which can lead to early destruction of the device due to current crowding effects.

In accordance with the present embodiments, the induced non-uniform electric field can allow the voltage (that is, the area under the electric field distribution) to increase when the drift region is flooded with excess majority and minority carriers under avalanche conditions (for example, during a UIS test). Hence, the I-V characteristics of the present embodiments exhibit positive differential resistance (PDR), balancing the current—in contrast to negative differential resistance (NDR) found in previous devices, which can cause filamentation and destruction. The current level at which the NDR sets in is called the snapback current (Isnapback). The present embodiments as described subsequently are configured to increase the snapback current by, for example, delaying the NDR in the reverse I-V characteristic. Although the following embodiments are described as an n-channel device, those skilled in the art will appreciate that the present embodiments are suitable for p-channel devices by reversing the described conductivity types or for complementary configurations.

FIG. 1 shows a partial cross-sectional view of an insulated gate field effect transistor (IGFET), MOSFET, LCB superjunction device, superjunction structure, charged-compensated, LCB structure, or switching device or cell 10 in accordance with a first embodiment that is configured to address the issues with prior devices described previously as well as others. By way of example, device 10 is among many such devices integrated with logic and/or other components into a semiconductor chip as part of a power integrated circuit. Alternatively, device 10 is among many such devices integrated together to form a discrete transistor device.

Device 10 includes a region of semiconductor material 11, which comprises for example, an n-type silicon substrate 12 having a resistivity in a range of approximately 0.001 to about 0.01 ohm-cm, and may be doped with arsenic or phosphorous. In the embodiment shown, substrate 12 provides a drain region for device 10, which is adjacent to a conductive layer 13. A semiconductor layer 14 is formed in, on, or overlying substrate 12 and can be n-type and doped light enough in one embodiment so as to not impact charge balance in the trench compensation regions described below. In one embodiment, layer 14 is formed using epitaxial growth techniques. In an embodiment suitable for a 650 volt device, layer 14 is doped n-type with a dopant concentration of about $1.0\times10^{13}$ atoms/cm$^3$ to about $5.0\times10^{14}$ atoms/cm$^3$, and has a thickness on the order of about 40 microns to about 70 microns. Note that, although semiconductor layer 14 is shown as thicker than substrate 12 in the drawings, substrate 12 can be thicker. It is shown this way for ease of understanding in the drawings. The thickness of layer 14 is increased or decreased depending on the desired BVdss rating of device 10. Additionally, those skilled in the art will understand that an insulated gate bipolar transistor (IGBT) device is achieved with the present structure by, for example, changing the conductivity type of substrate 12 to p-type (i.e., opposite to semiconductor layer 14). In an optional embodiment, substrate 12 may further include an n+ type buffer layer that is formed prior to semiconductor layer 14.

Device 10 further includes spaced apart filled trenches, compensating trenches, semiconductor material filled trenches, charge-compensated trench regions, LCB regions, LCB structures, charge-compensated filled trenches, compensation trenches, localized vertical charge compensation structures, or LCB regions or pillars 22. As used herein, charge compensation generally means that the total charge of the opposite conductivity type layers is substantially or generally balanced or equal. Charge-compensated filled trenches 22 include a plurality of layers or multiple pillars of material, conductive material or semiconductor material 220, including at least two layers, structures, or pillars of opposite conductivity type (i.e., at least one each of n-type and p-type), which may be separated by an intrinsic, buffer, or lightly doped semiconductor layer or layers. As shown in FIG. 1, material 220 includes a pillar or layer 221 of n-type semiconductor material adjoining semiconductor layer 14 along sidewall surfaces of the trenches.

In accordance with a one embodiment, layers 221 are of the same conductivity type as source regions 33, and form a primary vertical low resistance current path from the channel to the drain when device 10 is in the on-state. A layer 222 of compensating p-type semiconductor material is formed overlying layer 221. By way of example, n-type layers 221 and p-type layers 222 can have a dopant concentration on the order of about $1.0\times10^{15}$ atoms/cm$^3$ to about $1.0\times10^{17}$ atoms/cm$^3$, and each can have a thickness of about 0.1 microns to about 0.4 microns. Depending on the desired charge balance, the foregoing dopant concentrations are increased or decreased accordingly. When device 10 is in an off state, p-type layers 222 and n-type layers 221 compensate each other to provide an increased BVdss characteristic. Although no intrinsic or buffer layers are shown in the device of FIG. 1, it is understood that they may be present in earlier steps in fabrication and may not be as evident because dopant can diffuse into such layers during subsequent high temperature processing. In one embodiment, layers of semiconductor material 220 comprise a single crystalline semiconductor material and have as-formed dopant profiles.

In one embodiment, device 10 also includes one or more dielectric layers or a dielectric plug, or dielectric liner 28 formed overlying pillars 220 within trenches 22. In one embodiment, dielectric layer 28 is a deposited silicon oxide layer. In one embodiment, dielectric layer 28 can be multiple dielectric layers deposited or formed at different steps and can be different materials. Although not shown, it is understood that during the formation of device 10, n-type dopant from highly doped substrate 12 can diffuse into the lower portions of LCB trenches 22 so that those portions of trenches 22 within substrate 12 become more heavily doped n-type. When the optional n+ type buffer layer is used in conjunction with substrate 12, trenches 22 preferably extend into the n+ type buffer layer.

In accordance with the present embodiment, device 10 further includes imbalanced regions, doped regions, p-connection regions, top p-connection regions, or implanted regions 223 formed proximate to, at or along upper portions of trenches 22. Doped regions 223 are configured to make the top or upper portions of trenches 22 higher doped and in the case of the present embodiment, more p-dopant rich or p-rich. In one embodiment, a p-type (or n-type when device 10 is configured as a p-channel device) connection ion implant using a predetermined implant angle(s) to implant dopant into the superjunction trench area can be used to formed doped regions 223 to create a charge imbalance in LCB trenches 22. In one embodiment, about the upper 5 to 15 microns of the device can be made more p-rich in the superjunction trench area. In one embodiment, about the upper 10 microns of the device can be made more p-rich. In the present embodiment, an ion implant dose in a range from about $2.0\times10^{12}$ atoms/cm$^2$ to about $5.0\times10^{13}$ atoms/cm$^2$ can be used. In accordance with a first embodiment, an angled top boron implant can be performed into a charge balanced structure. The implant is such that part of the charge balanced structure is deliberately made more p-rich compared to previous structures to intentionally create a charge imbalance.

Additionally, it was observed that the charge imbalance along the superjunction column can be adjusted using different implant angles to form doped regions 223. For example, in one embodiment using a 200 KeV, $6.0\times10^{12}$ atoms/cm$^2$ dose and a 5 degree implant angle, the top 10 microns of the superjunction column are approximately 25% p-rich. As a result, the electric field remains less than flat (optimum) over a 25% charge imbalance window. In an alternative embodiment, the implant step can be done in multiple twist angles. In one embodiment, the implant step can be done with either two twist angles or four twist angles with a tilt angle of a few degrees.

Device 10 also includes a well, base, body or doped regions 31 formed in semiconductor layer 14 between and in proximity to, adjacent to, or adjoining LCB trenches 22. Body regions 31 can extend from major surface 18 of semiconductor material 11. In one embodiment, body regions 31 comprise p-type conductivity, and have a dopant concentration suitable for forming an inversion layer that operates as conduction channels 45 of device 10. Body regions 31 extend from major surface 18 to a depth of about 1.0 to about 5.0 microns. Those skilled in the art will appreciate that body regions 31 can comprise a plurality of individually diffused regions, or comprise a connected, single or commonly diffused region of selected shape, or can comprise combinations thereof.

N-type source regions 33 are formed within, above, or in body regions 31 and extend from major surface 18 to a depth of about 0.2 microns to about 0.5 microns. In one embodiment, portions of major surface 18 can extend down and then outward from the edges of source regions 33 so that contact is made to horizontal and vertical surfaces of source regions 33 by source contact layer 63. One or more p-type body contact regions 36 are formed in at least a portion of each body region 31. Body contact regions 36 are configured to provide a lower contact resistance to body region 31, and to lower the sheet resistance of body regions 31 under source regions 33, which suppresses parasitic bipolar effects.

Device 10 further includes a trench gate or control structure 157 adjoining body regions 31 and source regions 33. Control structure 157 is laterally spaced apart from adjacent charge-compensated trench 22. That is, control structure 157 does not overlie charge-compensated trench 22. Trench gate structure 157 includes a gate trench 158 and a gate dielectric layer 43 formed overlying surfaces of gate trench 158. In one embodiment, gate dielectric layer 43 comprises a silicon oxide, and has a thickness of about 0.05 microns to about 0.1 microns. In another embodiment, gate dielectric layer 43 has a thickness at the lower surfaces of gate trench 158 that is greater or thicker than the thickness of gate dielectric layer 43 along the sidewalls of gate trench 158. In alternative embodiments, gate dielectric layer 43 comprises silicon nitride, tantalum pentoxide, titanium dioxide, barium strontium titanate, or combinations thereof including combinations with silicon oxide, or the like.

Trench gate structure 157 further includes a conductive gate region 57 formed within control or gate trench 158 and overlies gate dielectric layer 43. In one embodiment, a source region 33 is interposed between a conductive gate region 57 and a charge compensation trench 22. Conductive gate region 57 comprises, for example, n-type polysilicon. Although conductive gate region 57 is shown as substantially co-planar with major surface 18, conductive gate region 57 may extend higher or above major surface 18 or may be recessed below major surface 18. Trench gate structure 157 is configured to control the formation of channels 45 and the conduction of current in device 10.

To facilitate a sub-surface current path, device 10 can further include n-type link, n-type doped layers or sub-surface doped layers 26. Specifically, doped layers 26 are configured to provide a sub-surface conduction path (i.e., horizontally-oriented conduction or current path) between the drain ends of channels 45 and n-type layers 221, which are the primary conduction layers or vertical conduction or current paths in LCB trenches 22. That is, in device 10 current flows vertically through channels 45, then horizontally through doped layers 26, and then vertically through layers 221. Doped layers 26 are configured so that current flow is isolated from major surface 18 by body regions 31 and body contact regions 36, which are opposite conductivity types (p-type) from doped layers 26 (n-type).

Source contact layer 63 is formed overlying major surface 18 and makes contact to both source regions 33 and body contact regions 36. Although shown as a partial layer, it is understood that source contact layer 63 can overlie major surface 18 and is isolated from gate electrode 57 by an interlayer dielectric structure (not shown). In one embodiment, source contact layer 63 comprises a titanium/titanium nitride barrier layer and an aluminum silicon alloy formed overlying the barrier layer, or other materials known to those of skill in the art. Drain contact layer 13 is formed overlying an opposing surface of semiconductor material 11, and comprises, for example, a solderable metal structure such as titanium-nickel-silver, chrome-nickel-gold, or the like.

The operation of device 10 proceeds as follows. Assume that source terminal 63 is operating at a potential $V_S$ of zero volts, conductive gate regions 157 receive a control voltage $V_G$=5.0 volts, which is greater than the conduction threshold of device 10, and drain terminal 13 operates at drain potential $V_D$=5.0 volts. The values of $V_G$ and $V_S$ cause body region 31 to invert adjacent conductive gate regions 157 to form vertical channels 45, which electrically connect source regions 33 to doped regions 26. A device current Id flows from drain terminal 13 and is routed through n-type pillars 221, doped layer 26, channels 45, source regions 33, to source terminal 63. Hence, current Id flows vertically through n-type pillars 221 to produce a low on-resistance, and horizontally through n-type links 26 keeping the current path isolated from major surface 18. In one embodiment, Id=1.0 amperes. To switch device 10 to the off state, a control voltage $V_G$ of less than the conduction threshold of the device is applied to conductive gate regions 157 (e.g., $V_G$<5.0 volts). This removes channels 45 and Id no longer flows through device 10. In the off state, n-type pillars 221 and p-type pillars 222 compensate each other as the depletion region from the primary blocking junction spreads, which enhances BVdss.

Figure 2:
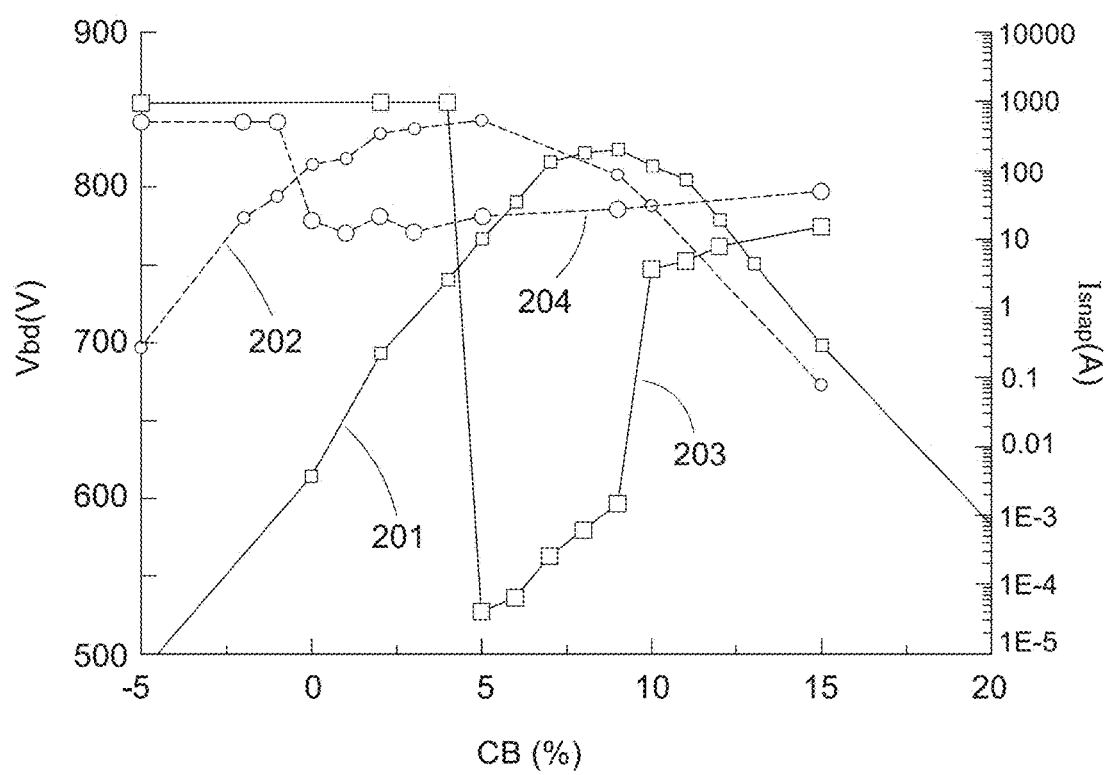
FIG. 2 illustrates graphical information of reverse current-voltage (I-V or IV) characteristics comparing a semiconductor device in accordance with the present invention with a prior structure.

FIG. 2 illustrates graphical information including breakdown voltage and snapback current as a function of charge balance comparing device 10 of the present embodiment to a previous device. Curve 201 is breakdown voltage for a prior device that does not have doped regions 223, curve 202 is breakdown voltage for device 10 with doped regions 223, curve 203 is snapback current for a prior device that does not have doped regions 223, and curve 204 is snapback current for device 10 with doped regions 223. In comparing curves 203 and 204 in FIG. 2, it is illustrated that doped regions 223 provide a charge imbalance that results in a reduction of NDR in the I-V characteristic, leading to higher snapback currents (lack of U-shape in Isnapback curve 204 compared to curve 203) hence better UIS capability. In one embodiment, the snapback current (onset of NDR) improves by over 5 decades compared to previous devices.

In other embodiments, is was observed that a 3 degree implant angle (using, for example, an ion implant dose of $6.0 \times 10^{12}$ atoms/cm$^2$ at 200 KeV) made approximately the top 20 microns of the superjunction column approximately 14% p-rich, a 7 degree implant angle made approximately the top 7 microns of the superjunction column approximately 33% p-rich, a 10 degree implant angle made approximately the top 5 microns of the superjunction column approximately 50% p-rich, and a 20 degree implant angle made approximately the top 3 microns of the superjunction column approximately 150% p-rich.

Additionally, UIS studies of device 10 showed that device 10 having doped regions 223 improved UIS robustness (for example, greater than 600 milli Joules (mJ)) compared to prior devices that do not have doped regions 223 (for example, approaching 0 mJ). Further, it was observed that the breakdown voltage distribution of device 10 has a more narrow distribution compared to previous devices that do not include doped regions 223, which is believed to be due to the purposely induced field imbalance in accordance with the present embodiment.

Figure 3:
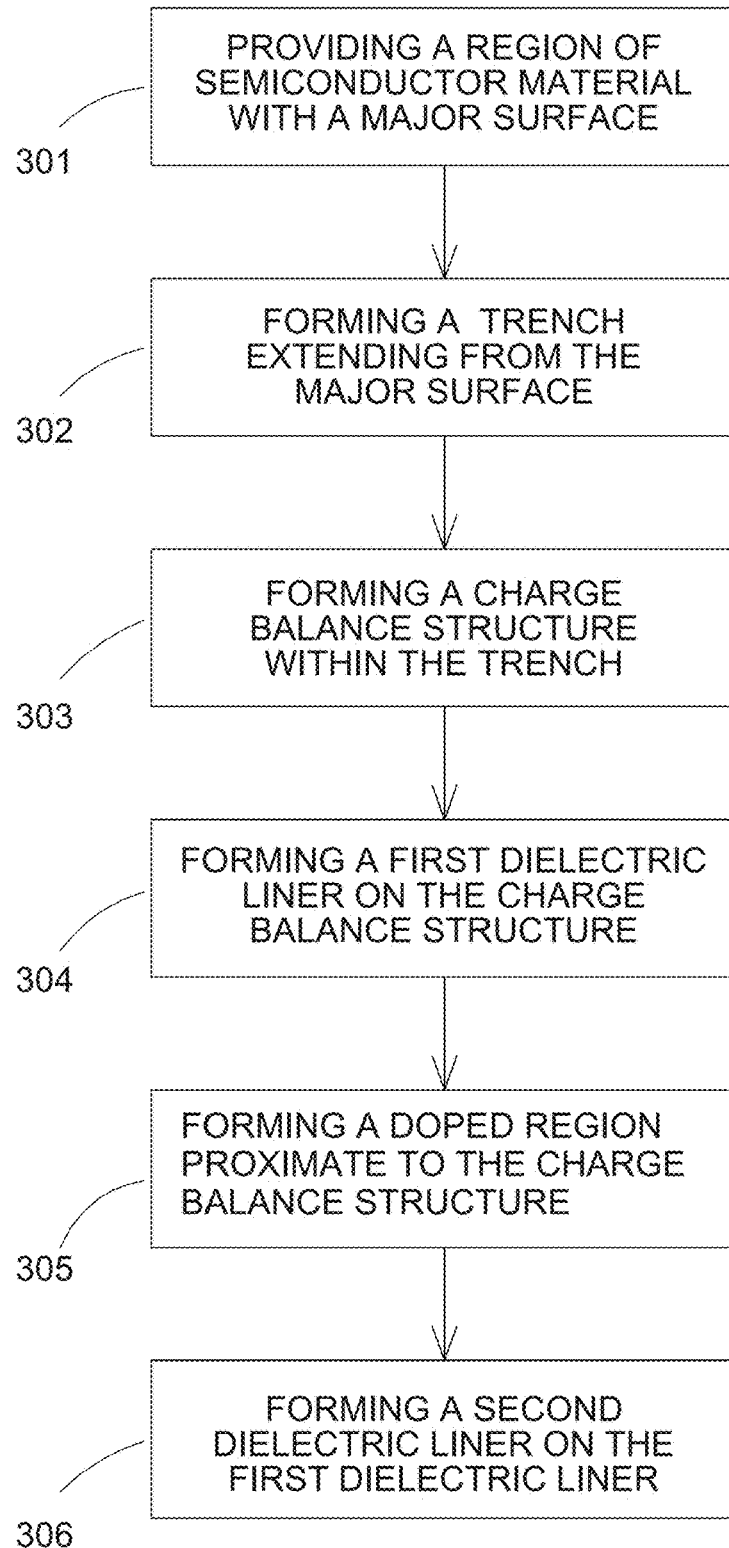
FIG. 3 illustrates an embodiment of a process flow for manufacturing a semiconductor device in accordance with the present invention.

FIG. 3 illustrates a process sequence to form doped regions 223 in a connection implant in accordance with an embodiment of the present invention. In a first step 301, region of semiconductor material 11 is provided with a hard mask formed on major surface 18. By way of example, the hard mask can be oxide-nitride-oxide configuration. Openings are then formed in the hard mask layer to expose portions of major surface 18 where trenches 22 will be formed.

In step 302, a trench etch is used to form trenches 22 extending from major surface 18 of region of semiconductor material 11. In one embodiment, Deep Reactive Ion Etching (DRIE) etching with a fluorine or chlorine based chemistry can be used to form trenches 22. Several techniques are available for DRIE etching trenches 22 including cryogenic, high-density plasma, or Bosch DRIE processing. In step 303, a superjunction structure, such as LCB structure 220, can then be formed within trenches 22. In one embodiment, an intrinsic epi—n-type epi—intrinsic epi—p-type epi—intrinsic epi pillar structure can be formed. In one embodiment, the superjunction structure is formed to be charge balanced. In step 304, a first dielectric liner can then be formed over the charge balanced structure. In one embodiment, an oxide can be used. In step 305, a connection implant or p-type implant can be made into the superjunction structure to form doped region 223 to connect body region 31 to the p-type pillar 222 and to create the charge imbalance of the present embodiment at a selected implant angle or angles as described previously. In step 306, a second dielectric liner can then be formed over the first dielectric liner to form dielectric structure 28.

In another embodiment, charge imbalancing of the superjunction column 222 can also be achieved by tailoring the doping profile of semiconductor layer 14 adjoining the superjunction trench 22, which can be intrinsic epi or i-epi. In accordance with the second embodiment, semiconductor layer 14 is provided with a non-uniform dopant profile. In one embodiment, semiconductor layer 14 is provided with a substantially linear graded dopant profile. In one embodiment, semiconductor layer 14 has a dopant concentration of about $8.0 \times 10^{13}$ atoms/cm$^3$ proximate to doped layers 26 of device 10, and then linearly increased over the thickness of semiconductor layer 14 towards substrate 12 to approximately $2.0 \times 10^{15}$ atoms/cm$^3$. This linear profile was observed to result in a linear variation of the CB across the superjunction column in trench 22 (for example, CB can vary over 40% across the SJ column). The resulting I-V characteristics of this embodiment showed no NDR up to very high current levels (for example, greater than 50 amps). In accordance with the present embodiment, the configuration showed that a linearly graded n-epi provides a positive differential resistance across a selected charge balance window, which improves UIS performance compared to prior superjunction devices. In a further embodiment, both doped regions 223 and the non-uniform dopant profile with semiconductor layer 14 can be used.

In view of all of the above, it is evident that a novel method and structure are disclosed. Included, among other features, is intentionally creating a charge imbalance in a LCB superjunction structure. In one embodiment, a doped region such as a p-type region is formed near an upper portion of the superjunction structure. In another embodiment, the semiconductor region adjacent to the superjunction structures has a non-uniform dopant profile with a lower dopant concentration near the upper surface of the superjunction structure and then increasing towards a lower portion of the superjunction structure. The resulting charge imbalance from the structure induces a non-uniform electric field and can allow the voltage (that is, the area under the electric field distribution) to increase when the drift region is flooded with excess majority and minority carriers under avalanche conditions (for example, during a UIS test) to improve performance. Hence, the I-V characteristic of the present embodiments exhibit positive differential resistance (PDR), balancing the current—in contrast to NDR found in previous devices, which can cause filamentation and destruction.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, described dopant conductivity types can be reversed.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

We claim:

1. A method for forming a semiconductor device structure comprising:
    providing a substrate having a first semiconductor layer overlying the substrate, wherein the first semiconductor layer has a major surface spaced apart from the substrate;
    forming a trench extending from the major surface into the first semiconductor layer, wherein the trench comprises a sidewall surface;
    forming a first region of a first conductivity type along the sidewall surface of the trench;
    forming a second region of a second conductivity type adjacent to the first region, wherein the first region and the second region form a local charge balanced structure;
    forming a control electrode proximate to the major surface and spaced apart from the local charge balanced structure;
    forming a body region adjacent to the major surface, wherein the body region is laterally interposed between the control electrode and the local charge balanced structure, wherein the local charge balanced structure adjoins a vertically oriented side surface of the body region and the first semiconductor layer adjoins a bottom surface of the body region, and wherein the body region extends downward from the major surface to a first depth, and wherein the control electrode is configured to control a channel region within the body region; and
    providing a first doped region of the second conductivity type proximate to the local charge balanced structure and configured to create a charge imbalance in the local charge balanced structure, wherein providing the first doped region comprises:
        providing the first doped region extending from the major surface to a top surface of the second region, wherein the first doped region has a dopant concentration higher than that of the second region, and wherein:
            a first portion of the first doped region overlaps a top portion of the first region to laterally connect the body region to the second region, the first portion of the first doped region abuts the vertically oriented side surface of the body region;
            the first doped region extends vertically downward from the major surface to a second depth greater than the first depth; and
            the first region separates a second portion of the first doped region from at least a portion of the vertically oriented side surface of the body region.

2. The method of claim 1, further comprising:
    forming a dielectric structure within the trench and disposed adjacent to the second region.

3. The method of claim 2, wherein forming the dielectric structure comprises:
    providing a first dielectric liner disposed adjacent to the second region; and
    providing a second dielectric liner adjacent to the first dielectric liner.

4. The method of claim 1, further comprising:
    forming a second doped region in the first semiconductor layer, wherein the second doped region is disposed below the body region, and wherein the second doped region is configured to connect a drain end of the channel region to the first region.

5. The method of claim 1, wherein providing the first doped region comprises ion implanting a dopant into upper portions of the local charge balanced structure.

6. The method of claim 5, wherein ion implanting the dopant comprises ion implanting the dopant using at least one angle between about 0 degrees and 20 degrees, and wherein ion implanting the dopant comprises ion implanting boron at an ion implant dose between about $6 \times 10^{12}$ atoms/cm$^2$ and about $5 \times 10^{13}$ atoms/cm$^2$.

7. A method for forming a semiconductor device comprising:
    providing a region of semiconductor material having a major surface;
    forming a trench extending from the major surface into the region of semiconductor material, wherein the trench has a sidewall surface;
    providing a superjunction structure in the trench and comprising a first region of a first conductivity type along the sidewall surface of the trench, the superjunction structure further comprising a second region of a second conductivity type adjacent to the first region;
    providing a body region adjacent to the major surface and the superjunction structure, the body region being configured to form a channel region, wherein the body region has a vertically oriented side surface adjoining the trench;
    providing a control electrode, wherein the control electrode and a portion of the body region are adjacent to each other;
    providing a source region adjacent to the body region; and
    providing a first doped structure extending from the major surface to a top surface of the second region and configured to create a charge imbalance within an upper portion of the superjunction structure, wherein the first doped structure has a dopant concentration higher than that of the second region, wherein:

providing the first doped structure comprises:

providing a first portion of the first doped structure overlapping a top portion of the first region and the sidewall surface of the trench to laterally connect the body region to the second region, the first portion of the first doped structure contacting the vertically oriented side surface of the body region, and providing a second portion of the first doped structure laterally separated from at least a portion of the vertically oriented side surface of the body region by another portion of the first region.

8. The method of claim 7, wherein providing the first doped structure comprises ion implanting a dopant into the upper portion of the superjunction structure.

9. The method of claim 7, further comprising:

providing a second doped structure in the region of semiconductor material, wherein the second doped structure is disposed below the body region, the second doped structure being configured to connect a drain end of the channel region to the superjunction structure.

10. The method of claim 7, wherein:

providing the region of semiconductor material comprises providing a semiconductor substrate and a semiconductor layer on the semiconductor substrate; and providing the superjunction structure comprises providing n-type and p-type semiconductor material pillars within the semiconductor layer.

11. The method of claim 7, wherein:

providing the first doped structure comprises providing the first doped structure extending from the major surface to a first depth; and providing the body region comprises providing the body region extending from the major surface to a second depth less than the first depth.

12. The method of claim 11, wherein the first depth is between 5 microns and 15 microns.

13. The method of claim 7, wherein providing the first doped structure creates the charge imbalance between about 5% and about 10%.

14. The method of claim 7, wherein providing the first doped structure comprises:

forming a first dielectric liner on the superjunction structure;

ion implanting a dopant into the upper portion of the superjunction structure; and forming a second dielectric liner on the first dielectric liner.

15. A method for forming a semiconductor device structure comprising:

providing a region of semiconductor material having a major surface;

providing a trench extending from the major surface into the region of semiconductor material, wherein the trench has a sidewall surface;

providing a first semiconductor layer of a first conductivity type overlying the sidewall surface of the trench;

providing a second semiconductor layer of a second conductivity type disposed within the trench, wherein the second semiconductor layer is disposed adjacent to the first semiconductor layer and wherein the trench, the first semiconductor layer, and the second semiconductor layer are configured to provide a local charge balanced structure;

providing a control electrode adjacent to the major surface and spaced apart from the local charge balanced structure;

providing a body region adjacent to the major surface, wherein the body region is laterally interposed between the control electrode and the local charge balanced structure, wherein the body region extends from the major surface into the region of semiconductor material to a first depth, and wherein the body region has a vertically oriented side surface adjoining the sidewall surface of the trench; and providing a first doped region of the second conductivity type extending from the major surface to a top surface of the second semiconductor layer and to a second depth, wherein:

the first doped region has a dopant concentration higher than that of the second semiconductor layer;

a first portion of the first doped region overlaps an upper portion of the first semiconductor layer and contacts the sidewall surface of the trench to laterally connect the body region to the second semiconductor layer;

the first portion of the first doped region abuts the vertically oriented side surface of the body region;

another portion of the first semiconductor layer laterally separates a second portion of the first doped region from at least a portion of the vertically oriented side surface of the body region; and the first doped region is configured to provide a charge imbalance within at least a portion of the local charge balanced structure.

16. The method of claim 15, wherein providing the first doped region comprises providing the first doped region so that the charge imbalance is between 5% and 10%.

17. The method of claim 15, further comprising providing a source region adjacent to the body region.

18. The method of claim 15, wherein providing the first doped region comprises providing the second depth between 5 microns and 15 microns.

19. The method of claim 15, wherein providing the first doped region comprises ion implanting a dopant into the local charge balanced structure.

20. The method of claim 19, wherein ion implanting the dopant comprises ion implanting the dopant using at least one angle between about 0 degrees and 20 degrees, and wherein ion implanting the dopant comprises ion implanting boron at an ion implant dose between about $6\times10^{12}$ atoms/$cm^2$ and about $5\times10^{13}$ atoms/$cm^2$.

* * * * *